(12) United States Patent
Tanaka

(10) Patent No.: US 8,300,213 B2
(45) Date of Patent: Oct. 30, 2012

(54) ILLUMINATION OPTICS APPARATUS, EXPOSURE METHOD, EXPOSURE APPARATUS, AND METHOD OF MANUFACTURING ELECTRONIC DEVICE

(75) Inventor: Hirohisa Tanaka, Tokyo (JP)

(73) Assignee: Nikon Corporation, Tokyo (JP)

( * ) Notice: Subject to any disclaimer, the term of this patent is extended or adjusted under 35 U.S.C. 154(b) by 766 days.

(21) Appl. No.: 12/287,497

(22) Filed: Oct. 8, 2008

(65) Prior Publication Data

US 2009/0128796 A1    May 21, 2009

Related U.S. Application Data

(60) Provisional application No. 60/996,033, filed on Oct. 25, 2007.

(30) Foreign Application Priority Data

Oct. 12, 2007  (JP) ................. 2007-267256

(51) Int. Cl.
*G03B 27/72* (2006.01)
*G03B 27/54* (2006.01)
(52) U.S. Cl. .......................... 355/71; 355/67
(58) Field of Classification Search .......... 355/52, 355/53, 55, 67–71; 359/355, 489, 738
See application file for complete search history.

(56) References Cited

U.S. PATENT DOCUMENTS

| | | | |
|---|---|---|---|
| 7,345,740 B2 * | 3/2008 | Wagner et al. | 355/71 |
| 7,423,731 B2 | 9/2008 | Tanitsu et al. | |
| 7,835,070 B2 * | 11/2010 | Mizuguchi | 359/355 |
| 2006/0055834 A1 | 3/2006 | Tanitsu et al. | |
| 2006/0170901 A1 | 8/2006 | Tanitsu et al. | |
| 2007/0146676 A1 * | 6/2007 | Tanitsu et al. | 355/71 |

FOREIGN PATENT DOCUMENTS

| | | |
|---|---|---|
| EP | 1 720 047 A1 | 1/2005 |
| JP | 60-063751 | 4/1985 |
| JP | 2007-263897 | 10/2007 |
| WO | 99/49504 | 9/1999 |
| WO | 2004/051717 | 6/2004 |
| WO | WO 2005/076045 A1 | 1/2005 |

OTHER PUBLICATIONS

International Search Report and Written Opinion for corresponding International Application No. PCT/JP2008/068206, mailed Nov. 4, 2008, 9 pages.

* cited by examiner

*Primary Examiner* — Hung Henry Nguyen
(74) *Attorney, Agent, or Firm* — Klarquist Sparkman, LLP

(57) ABSTRACT

An illumination optical apparatus which constantly controls a plurality of polarization states with high accuracy. An illumination optical system, which illuminates a pattern surface of a mask with illumination light, includes a polarization optical system and a depolarizer. The polarization optical system includes a half wavelength plate and PBS, which varies a polarization state of the illumination light to form a linear polarization state having a predetermined polarization direction. The depolarizer is arranged toward the mask from the polarization optical system and varies the polarization state of the illumination light emitted from the polarization optical system.

23 Claims, 5 Drawing Sheets

ILLUMINATION OPTICS APPARATUS, EXPOSURE METHOD, EXPOSURE APPARATUS, AND METHOD OF MANUFACTURING ELECTRONIC DEVICE

CROSS-REFERENCE TO RELATED APPLICATIONS

This application claims priority to, and the benefit of, U.S. Provisional Application No. 60/996,033, filed on Oct. 25, 2007, which claims priority to, and the benefit of, Japan Patent Application No. 2007-267256, filed on Oct. 12, 2007. Both these priority applications are incorporated herein by reference in their respective entireties.

BACKGROUND OF THE INVENTION

The present invention relates to illumination optical apparatus for illuminating an irradiated surface with illumination light in a plurality of polarization states, exposure techniques using such an illumination optical apparatus, and methods for manufacturing an electronic device with such an exposure technique.

A lithography process for manufacturing electronic devices (including micro-devices) such as a semiconductor device or a liquid-crystal display device uses an exposure apparatus such as a batch-exposure type projection-exposure apparatus, like a stepper, or a scanning-exposure type projection-exposure apparatus, like a scanning stepper, to transfer a pattern of a mask (reticle or photomask) onto each shot region of a wafer (or glass plate). In such an exposure apparatus, exposure wavelengths have been shortened to increase the resolution. Excimer laser light sources, such as a KrF excimer layer (wavelength, 248 nm) and ArF excimer laser (wavelength, 193 nm) are nowadays being used as exposure light sources. Further, to increase the resolution, polarization illumination is used to set the polarization state of illumination to a predetermined linear polarization in accordance with the pattern of a transfer subject. An excimer laser light source emits substantially linear polarization laser light and is thus optimal for use in polarization illumination.

During an actual application, depending on the pattern of a transfer subject, the polarization direction of illumination light may be set to a random and non-polarized state. Therefore, an exposure apparatus using an excimer laser light source as an exposure light source has been proposed in which a polarization control unit includes a rotatable half-wavelength plate and a quarter-wavelength plate, which are arranged in an illumination-optical system, and an optical member for setting a non-polarized state, which is freely positionable in and out of an optical path. The rotation of the wavelength plates and positioning of the optical member in the polarization-control unit are combined to control various polarization states of illumination light that illuminate a mask. For example, refer to International Patent Publication No. 2004/051717.

In the prior art, the polarization-control unit is formed under the assumption that the laser light from the excimer laser light is in a predetermined polarization state, for example, in linear polarization in a predetermined direction. However, changes may occur in the actual laser light emitted from a laser light source such as an excimer laser light source due to time-dependent change or other reasons. Further, when a light-transmission optical system or the like extends from the excimer laser light source to the polarization-control unit, and the optical path to the polarization-control unit is long, the polarization state of the laser light may slightly change from the excimer laser light source to the polarization-control unit.

In this manner, when the polarization state of the laser light that enters the polarization-control unit changes from the designed state, the polarization state of the laser light (illumination light) emitted from the polarization-control unit may deviate from the ideal polarization state. This may lower the resolution.

SUMMARY OF THE INVENTION

Accordingly, it is an object of the present invention to provide illumination-optical apparatus for illuminating an irradiated surface with illumination light in a plurality of polarization states, exposure techniques using such an illumination-optical apparatus, and techniques for manufacturing an electronic device with such exposure technique that constantly control the polarization state of illumination light with high accuracy.

One aspect of the present invention is an illumination-optical apparatus for illuminating an irradiated plane with illumination light. The illumination-optical apparatus includes a variable linear polarization mechanism arranged in an optical path of the illumination light and which varies the polarization state of the illumination light to form a linear polarization state having a polarization direction. A variable polarization-state mechanism is arranged in the optical path downstream from the variable linear polarization mechanism and varies the polarization state of the illumination light emitted from the variable linear polarization mechanism.

The present invention provides a variable polarization-state mechanism with linear polarization light polarized in a predetermined direction that is set by a variable linear polarization mechanism even when, for example, the polarization state of illumination light from an external light source or the like slightly changes due to the time-dependent change or the like. Further, light having a plurality of polarization states can be generated by supplying the variable polarization state mechanism with linear polarization light beams in different polarization directions. Accordingly, the polarization state can always be controlled with high accuracy.

DETAILED DESCRIPTION OF THE PREFERRED EMBODIMENTS

Figure 1:
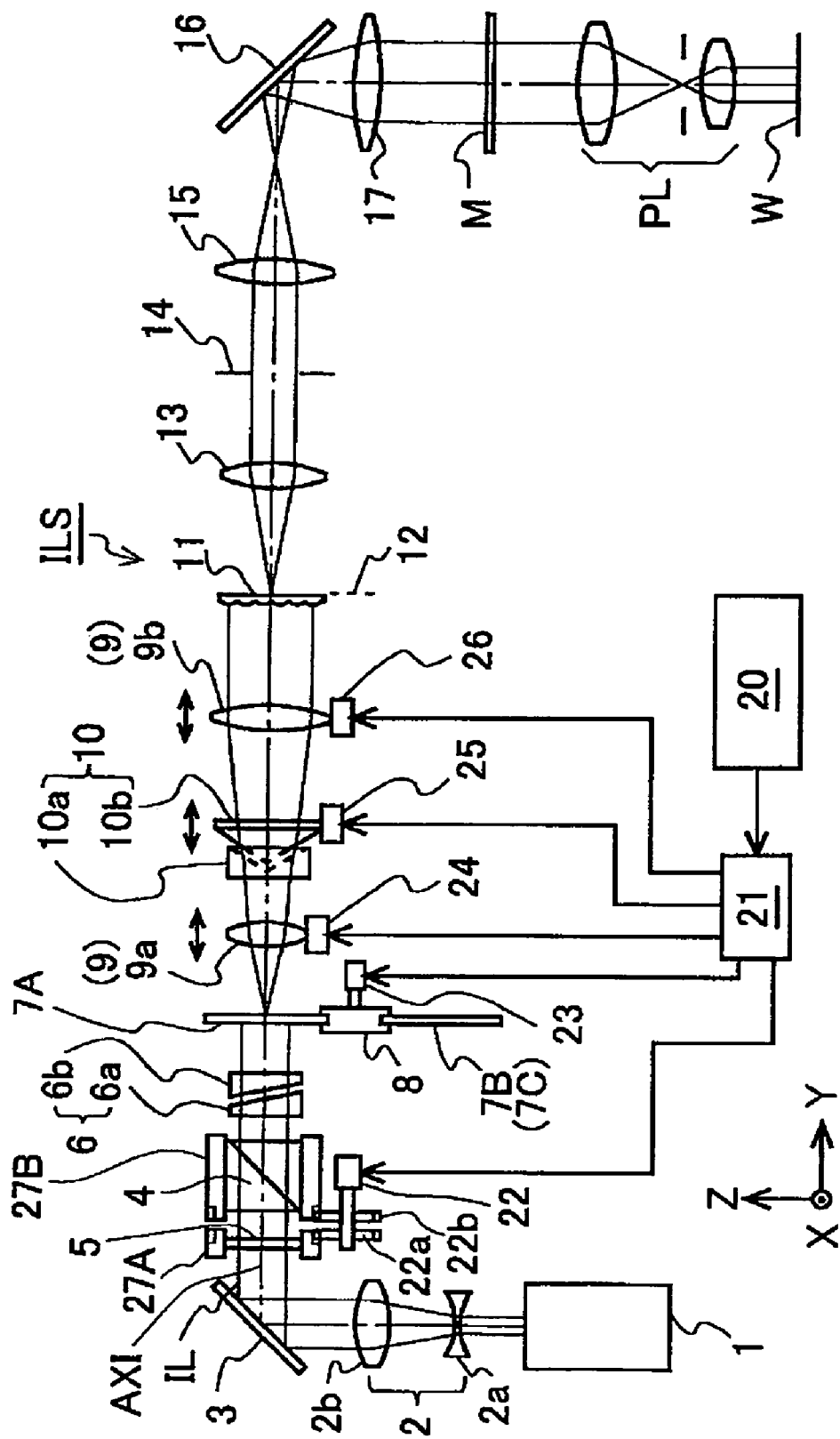
FIG. 1 is a schematic diagram showing one example of an exposure apparatus including an illumination-optical system in an embodiment according to the present invention.

One example of an embodiment of the present invention will now be discussed with reference to the drawings. FIG. 1 shows an exposure apparatus including an exposure light source 1, an illumination-optical system ILS for illuminating a pattern surface (mask surface) of a mask M with exposure illumination light (exposure light) IL from the light source 1, a mask stage (not shown) for positioning the mask M, a projection-optical system PL for projecting a pattern image of the mask M onto a wafer W (photosensitive substrate), a wafer stage (not shown) for positioning the wafer W, and a main control system 20 for centrally controlling the operation of the entire device, and various types of drive systems. In FIG. 1, a direction normal to the plane on which the wafer W is placed is set as the Z axis, a direction parallel to the plane of FIG. 1 in a plane orthogonal to the Z axis is set as the Y axis, and the direction orthogonal to the plane of FIG. 1 is set as the X axis.

The exposure apparatus of FIG. 1 includes as the light source 1 an ArF excimer laser light source, which supplies laser light of substantially linear polarization having a wavelength of 193 nm. As the light source 1, a KrF excimer laser light source supplying laser light having a wavelength of 248 nm, an $F_2$ laser light source supplying laser light having a wavelength of 157 nm, a high-harmonic-wave generation device of a solid-state laser light source, or a mercury lamp for supplying bright lines such as i-lines (365 nm) may be used.

The illumination light IL, which includes substantially linear polarization laser light of substantially parallel light beams emitted in the Z direction from the light source 1, has a rectangular cross-section elongated in the X direction and enters a beam expander 2 (shaping optical system), which includes two lenses 2a and 2b having refractive powers in the ZY plane. The beam expander enlarges the cross-sectional shape of the illumination light IL in the Y direction so as to shape light having a predetermined cross-section.

The illumination light IL emitted from the beam expander 2 is reflected in the Y direction by an optical path deflection mirror 3. Then, the illumination light IL sequentially travels along the optical axis AXI of the illumination-optical system ILS and sequentially through a half-wavelength plate 5, a prism type polarization beam splitter (hereafter referred to as a PBS) 4, and a depolarizer 6 to enter one of diffractive optical elements (DOEs) 7A, 7B, and 7C. The half-wavelength plate 5, PBS 4, and depolarizer 6 form a polarization-control unit.

Figure 2A:
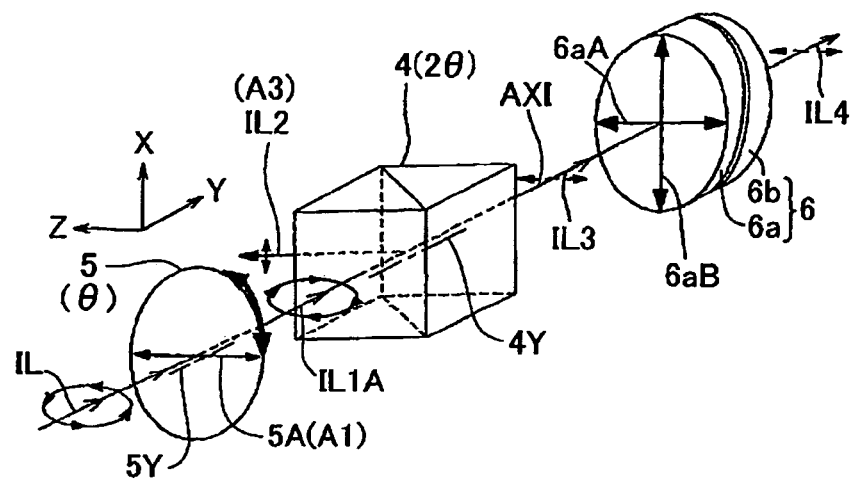
FIGS. 2(A), 2(B), and 2(C) are each perspective views showing the structure of a polarization-control unit of FIG. 1.
Figure 2B:
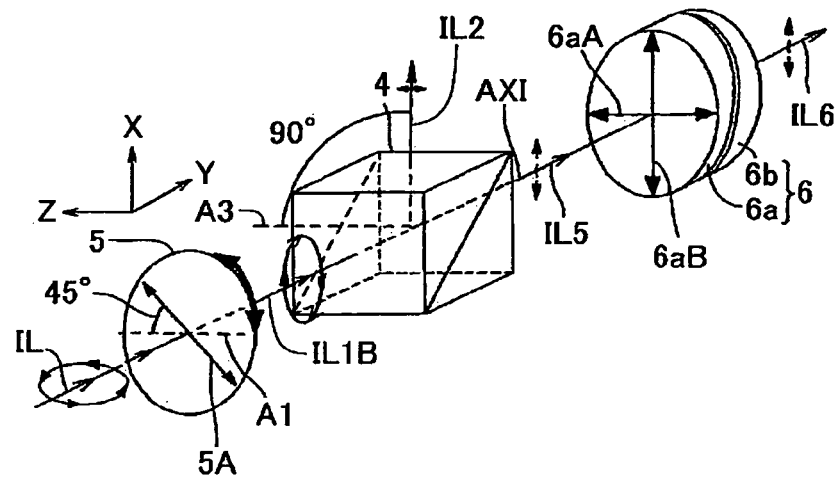
Figure 2C:
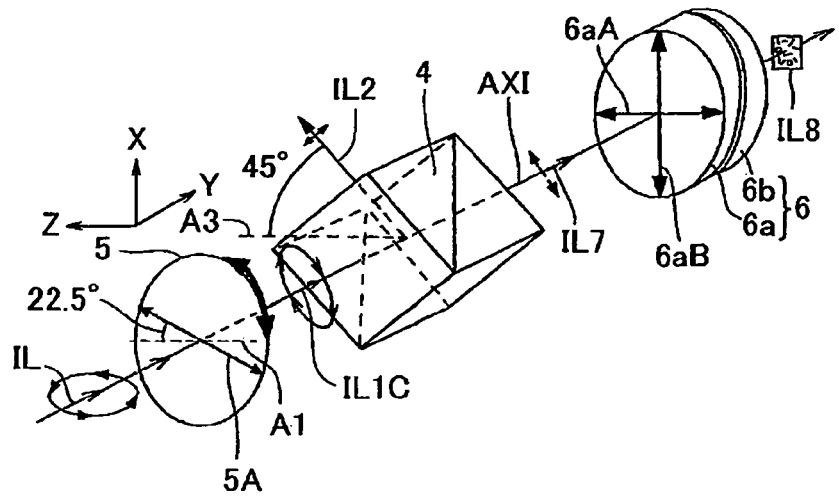

FIGS. 2(A), 2(B), and 2(C) are perspective views showing the polarization-control unit of FIG. 1. In FIG. 2(A), the half-wavelength plate 5 and PBS 4 are respectively supported to be rotational about axis 5Y and axis 4Y, which are each parallel to the optical axis AX, in the clockwise and counter-clockwise directions. Further, when the half-wavelength plate 5 is rotated about the axis 5Y by angle θ, the PBS 4 is formed so as to be rotated about the axis 4Y by an angle that is two times greater (2θ). An initial state in which the rotational angle θ of the half-wavelength plate 5 is zero is defined by a state in which a first crystal axis 5A (described later) of the half-wavelength plate 5 extends through the optical axis AXI parallel to the Z axis. A further initial state in which the rotational angle (2θ) of the PBS 4 is zero is defined by a state in which, among the light beams entering the PBS 4 parallel to the optical axis, the light beam reflected by the polarization beam splitter surface of the PBS 4 is emitted along axis A3, which is parallel to the Z axis. In this embodiment, the axis 5Y and axis 4Y are concurrent with the optical axis AXI, which is a common rotation axis.

Returning to FIG. 1, in one example, the half-wavelength plate 5 and the PBS 4 are respectively held by cylindrical holding members 27A and 27B and each accommodated in a barrel (not shown). The barrels are each supported by a support frame (not shown) for the illumination-light system ILS. Gears are formed on part of the outer surface of each of the holding members 27A and 27B. A drive shaft, which is parallel to the optical axis AXI and fixed to gears 22a and 22b, and a drive unit 22, which rotates the drive shaft, are supported by the support frame. The drive shaft incorporates a rotary encoder (not shown), which monitors the rotation angle. The gears 22a and 22b are respectively mated with gears formed on the holding members 27A and 27B formed on barrel openings (not shown). In this case, the ratio of the number of teeth on the gear 22a relative to that of the holding member 27A is set to be two times greater than the ratio of the number of teeth on the gear 22b relative to that of the holding member 27B. As a result, when the gears 22a and 22b are rotated integrally by the drive unit 22 and the rotation angle of the half wavelength plate 5 becomes θ, the rotation angle of the PBS 4 becomes 2θ. In accordance with a command for setting the polarization illumination light from the main control system 20, an illumination-control system 21 controls the rotation angle θ with the drive unit 22. The polarization-control unit will be described in detail later.

In FIG. 1, diffractive optical elements such as the diffractive optical elements 7A, 7B, and 7C, which are formed on a glass substrate by two-dimensional microscopic steps having exposure wavelengths, function to diffract the incident beams at various angles. The diffractive optical element 7A is a scattered light formation element functioning to diffract the incident rectangular parallel light beams and form a circular light beam in a far field. Further, the diffractive optical elements 7B and 7C, which are for dipolar illumination, function to diffract the incident illumination light IL and form illumination regions (illumination fields) at two locations respectively eccentric in the X direction and Z direction (corresponding to Y direction of mask surface) and symmetric to the optical axis AXI in the far field. Further, quadrupolar illumination diffractive optical elements (not shown), which form illumination regions at four eccentric locations, and annular illumination diffractive optical elements (not shown), which form annular illumination regions, are used. In one example, the diffractive optical elements such as the diffractive optical elements 7A, 7B, and 7C are held around a circular plate 8. In accordance with commands from the main control system 20 for setting the illumination conditions, the illumination-control system 21 rotates the circular plate 8 with a drive unit 23 of a rotation motor or the like. This arranges the diffractive optical elements on the optical path of the illumination light IL in accordance with the illumination conditions. In the state shown in FIG. 1, the diffractive optical element 7A, which is for normal illumination, is set in the optical path of the illumination light IL.

In FIG. 1, the light beams diffracted by the diffractive optical element 7A (or 7B and 7C etc.) illuminates a micro-lens array 11, which serves as an optical integrator, through a former lens system 9a, an axicon system 10 including a first prism 10a having a concave conical surface and a second prism 10b having a convex conical surface, and a latter lens system 9b. The former lens system 9a and the latter lens system 9b form a zoom lens (variable-magnification system) 9, which continuously varies the focal length within a predetermined range. The zoom lens 9 optically conjugates the emission surface of the diffractive optical element 7A and a rear focal plane of the micro-lens array 11. In other words, the zoom lens 9 generate a substantially Fourier transform relationship with an emission surface of the diffractive optical element 7A and an incident surface of the micro-lens array 11.

The illumination light IL emitted from the diffractive optical elements (7A etc.) forms illumination regions (illumination fields) having predetermine shapes, such as a circular shape or a dipolar shape, on the rear focal plate of the zoom lens 9 (and ultimately, the incident surface of the micro-lens array 11). In this manner, the diffractive optical element (7A, etc.) and the zoom lens 9 form an illumination-region formation means. The size of the entire illumination region varies in accordance with the focal length of the zoom lens 9. The lens systems 9a and 9b of the zoom lens 9 are each driven along the optical axis AXI based on a command from the illumination-control system 21 by drive units 24 and 26 including, for example, slide mechanisms. This controls the focal length of the zoom lens to a predetermined value.

In the axicon system 10, conical surfaces of the first prism 10a and second prism 10b are arranged facing toward each other. The second prism 10b is driven along the optical axis AXI based on a command from the illumination-control system 21 by a drive unit 25 including, for example, a slide mechanism. In this manner, the interval between the prisms 10a and 10b along the optical axis AX1 is controlled to control the radial position of the light beam emitted from the diffractive optical element (7A, etc.) on the incident surface of the micro-lens array 11 with respect to the optical axis AXI. Accordingly, when using, for example, dipolar illumination regions 32A and 32B shown in FIG. 3(B) and described later, by controlling the interval between the prisms 10a and 10b of the axicon system 10, the distance of the centers of the illumination regions 32A and 32B from the optical axis AXI can be controlled. Further, by controlling the focal distance of the zoom lens 9, the size of each of the illumination regions 32A and 32B can be controlled.

The micro-lens array 11 is an optical device formed by a matrix of multiple densely arranged microscopic lenses having positive refractive power. Each microscopic lens of the micro-lens array 11 includes a rectangular cross-section, which is in similarity with the shape of the illumination field that is to be formed on the mask M (consequently, the shape of the exposure region that is to be formed on a wafer W). Generally, a micro-lens array is formed by conducting an etching process on a parallel planar glass plate to produce a micro-lens group. The micro-lenses in the micro-lens array are smaller than the lens elements of a normal fly's-eye lens. To clarify the drawing, the micro-lens array 11 is shown with much fewer lesser micro-lenses than actually present.

Accordingly, the light beams entering the micro-lens array 11 is divided two-dimensionally by the plurality of micro-lenses so as to form many secondary light sources at rear focal planes of the micro-lenses. In this manner, on a pupil plane (illumination pupil plane) 12 of the illumination-optical system ILS, which serves as the rear focal plane of the micro-lens array 11, secondary light sources having substantially the same light-intensity distribution as the illumination fields are formed by the light beams entering the micro-lens array 11 (for example, circular regions or the dipolar illumination regions 32A and 32B, etc.), that is, secondary light sources are formed by substantially planar light sources about the optical axis AXI.

In FIG. 1, the illumination light IL from the secondary sources formed on the rear focal plane (illumination pupil plane 12) of the micro-lens array 11 is regulated by an aperture stop (not shown), which determines the light-intensity profile of the illumination regions, when necessary. Then, the illumination light IL travels through a first relay lens 13, a mask blind 14 (view stop), a second relay lens 15, an optical-path deflection mirror 16, and a condenser-optical system 17 to illuminate a mask M in a superimposed manner. The illumination-optical system ILS is formed by the optical members from the beam expander 2 to the polarization-control unit and by the optical members from the diffractive optical elements (7A etc.) to the condenser-optical system 17.

The illumination light IL that has traveled through the pattern of the mask M proceeds to a projection-optical system PL and forms an image of the mask pattern of a wafer W to which resist (photosensitive material) is applied. In this manner, the pattern of the mask M is sequentially exposed onto each shot region of the wafer W by performing batch exposure or scanning exposure while two-dimensionally drive-controlling the wafer W on a plane (XY plane) that is orthogonal to the optical axis of the projection-optical system PL (parallel to Z axis).

In batch exposure, a mask pattern is batch-exposed onto the shot regions of a wafer through a so-called step-and-repeat technique. In this case, the illumination regions on the mask M have a rectangular shape that is close to a square, and the cross-section of each micro-lens in the micro-lens array 11 has a rectangular shape that is close to a square. In scanning exposure, a mask pattern is exposed onto the shot regions of the wafer W while moving the mask M and wafer W relative to the projection-optical system PL. In this case, the illumination region on the mask M has a rectangular shape in which the ratio of the short side to the long side is, for example, 1:3. The micro-lenses of the micro-lens array 11 each have a similar rectangular cross-sectional shape.

The structure and operation of the polarization-control unit, which includes the half-wavelength plate 5, the PBS 4, and the depolarizer 6 in the illumination-optical system ILS of FIG. 1 will now be discussed. In FIG. 2, to facilitate illustration, the illumination light IL that travels through the polarization-control unit is expressed as illumination lights IL1A, IL1B, IL1C, IL2, IL3, IL4, IL5, IL6, IL7, and IL8.

Referring to FIG. 2(A), the half-wavelength plate 5 is formed by a disk-shaped substrate orthogonal to the optical axis AXI (axis parallel to Y axis) and having a size that covers the cross-sectional shape of the incident illumination light IL. The half-wavelength plate 5 is formed by a material of a predetermined thickness having a double refraction property (a birefringence property) such as crystal or magnesium fluoride ($MgF_2$), which transmits ArF excimer laser. Further, the half-wavelength plate 5 includes the first crystal 5A and a second crystal (not shown) orthogonal to the first crystal 5A. When the half-wavelength plate 5 emits light, which entered with exposure wavelength $\lambda$, a phase difference of 180° ($\lambda/2$) is produced between polarization components in the direction of the first crystal 5A and polarization components in the direction of the second crystal.

In this embodiment, for example, the drive unit 22 shown in FIG. 1 need only rotate the half-wavelength plate 5 about the optical axis AXI (axis 5Y) 45° and 22.5° in the clockwise direction (or the counterclockwise direction) from the initial state, as shown in FIGS. 2(B) and 2(C). Accordingly, the limit switches may be arranged in the drive unit 22 in lieu of a rotary encoder to detect the half wavelength plate 5 being in an initial state and a state rotated from the initial state by 45° and 22.5°.

In this embodiment, the light source 1 of FIG. 1 is an ArF excimer laser source, and the polarization direction of the illumination light IL when entering the half-wavelength plate 5 of FIG. 2(A) is set to be the Z direction. However, slight light-emission changes or time-dependent changes of the light source 1 and vibrations of a beam-matching unit (not shown) may result in the polarization state of the illumination light entering the half-wavelength plate 5 shown in FIG. 2(A) slightly displaces the polarization direction in the Z direction or slightly becomes an elliptical polarization. Hereinafter, for the sake of brevity, the polarization state (state of electric-field vector) of the illumination light IL entering the half-wavelength plate 1 is an elliptical polarization elongated in a direction substantially parallel to the Z axis.

Further, the PBS 4 may be manufactured by applying a polarization-beam-splitter film to the bonding surfaces of two prisms, which have cross-sectional shapes of a regular triangle and are formed by optical materials such as silica and fluorite ($CaF_2$) that transmit Arf excimer laser (wavelength, 193 nm), and then bonding the two prisms together. In the illumination light entering the half-wavelength plate 5, the PBS 4 transmits illumination light of P-polarization components (light that is linearly polarized parallel to the incident surface) toward the depolarizer 6 and reflects illumination light IL of S-polarization components (light that is linearly polarized orthogonal to the incident surface). For example, in this embodiment, the half-wavelength plate 5 has rotation angle θ, whereas the PBS 4 has rotation angle 2θ. Thus, when the rotation angle of the half-wavelength plate 5 is 45° and 22.5°, the rotation angle of the PBS 4 is 90° and 45°. Even if the polarization state of the illumination light IL entering the half-wavelength plate 5 changes, the employment of the PBS 4 supplies the depolarizer 6, which is in a latter stage, with illumination light linearly constantly polarized in the desired direction. This controls polarization with high accuracy.

The depolarizer 6 shown in FIG. 1 is formed supporting a wedge-type crystal prism 6a and a wedge-type silica glass prism 6b, which are arranged in the thicknesswise direction with a support frame (not shown). The crystal prism 6a is disk-shaped, large enough to cover the cross-sectional shape of the illumination light IL, and has a central axis that is parallel to the optical axis AX1. The silica glass prism 6b is shaped in a manner complementary to the crystal prism 6a (for example, the crystal prism 6a and silica glass prism 6b are shaped to be substantially identical and arranged near each other in a state in which the rotation angles differ by 180°). In lieu of the crystal prism 6a, a prism formed from a material having a double-refraction property such as magnesium fluoride, which transmits ArF excimer laser. When using only the crystal prism 6a, the optical path of the illumination light IL is bent. Thus, to prevent the optical path of the illumination light IL from being bent, the silica glass prism 6b is used so that the depolarizer 6 becomes planar in its entirety. In lieu of the silica glass prism 6b, a prism formed from an optical material having no double-refraction property or having a weak double-refraction property such as fluorite, which transmits ArF excimer laser, may be used.

Referring to FIG. 2(A), the crystal prism 6a of the depolarizer 6 includes a first crystal axis 6aA and a second crystal axis 6aB, which extend perpendicularly to each other and have different refraction indexes in each of their directions. In one example, the crystal prism 6a has a thickness that is constant in a direction parallel to the first crystal axis 6aA and varies in a substantially linear manner in a direction parallel to the second crystal axis 6aB. Further, the crystal prism 6a is stably supported at an angle in which the first crystal axis 6aA of the crystal prism 6a is parallel to the Z axis and the second crystal axis 6aB is parallel to the X axis.

Figure 3A:
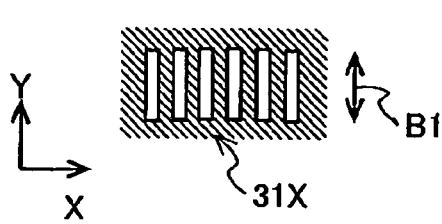
FIG. 3(A) is a diagram showing one example of a transfer subject pattern.

When a pattern on the mask M of FIG. 1 that is subject to transfer is a line-and-space pattern (hereafter referred to as a L&S pattern) 31X formed to have a fine pitch in the X direction as shown in FIG. 3(A), its illumination light results in dipolar illumination in the X direction, and the polarization direction B1 of the illumination light becomes linearly polarized in the Y direction. In this case, based on an instruction from the main control system 20 shown in FIG. 1, the illumination-control system 21 arranges the dipolar illumination diffractive optical element 7B to increase the luminance of the two illumination regions 32A and 32B, which are spaced apart in the X direction, on the illumination pupil plane 12, as shown in FIG. 3(B). Further, the illumination-control system 21 keeps the rotation angles of the half-wavelength plate 5 and PBS 4 in the initial state of FIG. 2(A).

As a result, in FIG. 2(A), the illumination light IL, which is elliptically polarized substantially parallel to the Z axis and is entering the half-wavelength plate 5, enters the PBS 4 as illumination light IL1A of substantially the same elliptical polarization (although the rotation direction of the electric-field vector is reversed). In the illumination light IL1A that enters the PBS 4, the illumination light IL3 (P-polarization component), which is linearly polarized in the Z direction and has a large luminance, is transmitted through the PBS 4 to enter the depolarizer 6. The illumination light IL2, which is an S-polarized component having a small luminance, is reflected. In this case, the polarization direction of the illumination light IL3 is parallel to the first crystal axis 6aA of the crystal prism 6a. Thus, the crystal prism 6a and the depolarizer 6 emit the illumination light IL4, the polarization direction of which is Z direction linear polarized, that is the same as during incidence. In FIG. 1, an optical-path deflection mirror 16 is used. Thus, the Z direction of the polarization-control unit and the illumination pupil plane 12 correspond to the Y direction on the mask M.

Further, the dipolar illumination regions 32A and 32B of the illumination pupil plane 12 shown in FIG. 3(B) is illuminated by the illumination light IL4, which is a linearly polarized light in which the polarization direction B2 is the Z direction. The L&S pattern 31X shown in FIG. 3(A) is illuminated by the dipolar illumination that is linearly polarized in the Y direction. Thus, the L&S pattern 31X is transferred to the wafer W with a high resolution.

Figure 3C:
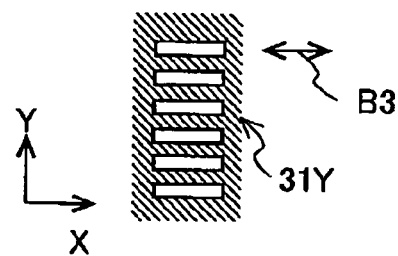
FIG. 3(C) is a diagram showing a further example of a transfer subject pattern.
Figure 3B:
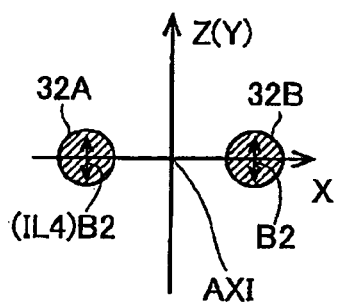
FIG. 3(B) is a diagram showing one example of dipolar illumination.
Figure 3D:
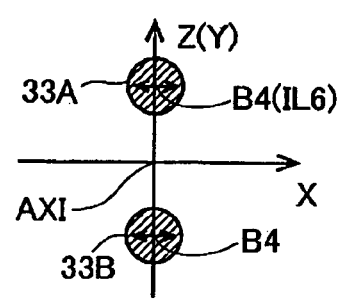
FIG. 3(D) is a diagram showing a further example of dipolar illumination.

When a pattern on the mask M of FIG. 1 that is subject to transfer is an L&S pattern 31Y formed to have a fine pitch in the Y direction as shown in FIG. 3(C), its illumination light results in dipolar illumination in the Y direction, and the polarization direction B3 of the illumination light becomes linearly polarized in the X direction. In this case, the dipolar illumination diffractive optical element 7C is arranged in the optical path of the illumination light of FIG. 1 to increase the luminance of the two illumination regions 33A and 33B, which are spaced apart in the X direction, on the illumination pupil plane 12, as shown in FIG. 3(D). Further, the illumination-control system 21 shifts the rotation angle θ of the half-wavelength plate 5 from the initial state to 45° and shifts the rotation angle (2θ) of the PBS 4 from the initial state to 90°. That is, the first crystal axis 5A of the half-wavelength plate 5 is rotated about the optical axis AXI by 45° from the initial state in which it is parallel to line A1. This rotates the PBS 4 so that the linearly polarized light (polarized in the X direction) is transmitted through the PBS 4.

As a result, in FIG. 2(B), the elliptically polarized illumination light IL undergoes a 90° rotation in polarization direction at the half-wavelength plate 5 and enters the PBS 4 as illumination light IL1B having an elliptical polarization elongated in a direction substantially parallel to the X axis (although the rotation direction of the electric field vector is reversed). In the illumination light IL1B, the illumination light IL5 (P-polarization component), which is linearly polarized in the X direction and has a large luminance, is transmitted through the PBS 4 to enter the depolarizer 6. The illumination light IL2, which is an S-polarization component having a small luminance, is reflected. In this case, the polarization direction of the illumination light IL5 is parallel to the second crystal axis 6aB of the crystal prism 6a. Thus, the crystal prism 6a and the depolarizer 6 emit the illumination light IL6, the polarization direction of which is X direction linearly polarized, that is the same as during incidence. Further, the dipolar illumination regions 33A and 33B of the illumination pupil plane 12 shown in FIG. 3(D) are illuminated by the illumination light IL6, which is linearly polarization, of which the polarization direction B4 is the X direction. The L&S pattern 31Y shown in FIG. 3(C) is illuminated by the dipolar illumination that is linearly polarized in the X direction. Thus, the L&S pattern 31Y is transferred to the wafer W with high resolution.

When a pattern on the mask M of FIG. 1 that is subject to transfer is, for example, a rough pattern having a low density, the polarization state of the illumination light is set to random polarization (non-polarized). In this case, for example, the diffractive optical element 7A is arranged in the optical path of the illumination light of FIG. 1. Further, the illumination-control system 21 shifts the rotation angle θ of the half-wavelength plate 5 from the initial state to 22.5° (45°/2) and the rotation angle (2θ) of the PBS 4 from the initial state to 45°. That is, the first crystal axis 5A of the half wavelength plate 5 is rotated about the optical axis AXI by 22.5° from the initial state in which it is parallel to line A1. This rotates the PBS 4 so that the linearly polarized light polarized in a direction intersecting the Z axis (and the X axis) at 45° is transmitted through the PBS 4.

As a result, in FIG. 2(C), the elliptically polarized illumination light IL undergoes a 45° rotation of polarization direction at the half-wavelength plate 5 and enters the PBS 4 as illumination light IL1C having an elliptical polarization elongated in a direction intersecting the Z axis (and the X axis) at substantially 45°. In the illumination light IL1C, the illumination light IL7 (P-polarization component), which is linearly polarized in a direction diagonally intersecting the Z axis (and the X axis) at 45° and has a large luminance, is transmitted through the PBS 4 to enter the depolarizer 6. The illumination light IL7, which is an S-polarization component having a small luminance, is reflected. In this case, the polarization direction of the illumination light IL7 is inclined by 45° to the two crystal axes 6aA and 6aB of the crystal prism 6a, and the thickness of the crystal prism 6a gradually varies along the polarization direction. Thus, the crystal prism 6a and the depolarizer 6 emit non-polarized illumination light IL8, the polarization direction (or shape of elliptical polarization) of which varies randomly depending on the incident position of the illumination light IL7. Accordingly, the illumination light IL8 irradiates the mask in a superimposed manner via the micro-lens array 11 (optical integrator) of FIG. 1 to illuminate the pattern of the mask with non-polarized illumination light.

The exposure apparatus of this embodiment controls the rotation angles of the half-wavelength plate 5 and the PBS 4 in the illumination-optical system ILS to set the polarization state of the illumination light that illuminates the mask M to a linearly polarized state in which the polarization direction is the X direction, linearly polarized state in which the polarization direction is the Y direction, and non-polarized state in which the polarization directions are random. Accordingly, the polarization state of the illumination light is easily optimized in accordance with the pattern that is subject to transfer. Thus, various types of patterns can be exposed to the wafer W with a high resolution.

It is desirable that the PBS 4 have a complete or high extinction ratio. However, as long as the transmission rate of the PBS 4, which is for linear polarization in a polarization direction generally perpendicular to a desired polarization direction, is 10% or less, a pattern can be exposed without decreasing the contrast of a wafer pattern for a great extent.

This embodiment has the advantages described below.

(1) In an illumination-optical apparatus for illuminating a pattern surface (mask surface, irradiated surface), the illumination-optical system ILS of FIG. 1 includes a polarization optical system (5, 4) (linear-polarization variable mechanism) and the depolarizer 6 (variable-polarization-state mechanism). The polarization optical system includes the half-wavelength plate 5 and the PBS 4, which are arranged in the optical path of the illumination light to vary (control) the polarization state of the illumination light to a linearly polarized state having a polarization direction in a predetermined direction (one of the Z direction, X direction, and diagonal direction as viewed in FIG. 2(A)). The depolarizer 6 is arranged downstream from the polarization optical system (5, 4) (toward the mask surface) to vary (control) the polarization state of the illumination light emitted from the polarization optical system. Accordingly, even if the polarization state of the illumination light IL supplied to the polarization optical system (5, 4) from the light source 1 changes due to time-dependent changes, the polarization optical system (5, 4) supplies the depolarizer 6 with illumination light having a large luminance and that is linearly polarized accurately in one of three directions. The depolarizer 6 then generates illumination light of three different polarization states.

Accordingly, a plurality of polarization states are constantly controlled with high accuracy.

(2) Further, as shown in FIGS. 2(A) to 2(C), when the incident illumination light IL is elliptically polarized (or linearly polarized) in substantially the Z direction, the state of linear polarization in the Z direction or X direction is referred to as a first polarization state, and the state of linear polarization in a direction intersecting the Z axis (or X axis) at 45° is referred to as a second polarization state. Here, the polarization optical system (5, 4) includes the half-wavelength plate 5 (variable linear polarization element) and the PBS 4 (linear polarization extraction element). The half-wavelength plate 5 varies the illumination light IL to illumination light IL1A (or IL1B), which is in a polarization state (substantial first polarization state) and substantially parallel to the Z axis (or X axis), or varies the illumination light IL to illumination light IL1C, which is in a polarization state (substantial second polarization state) intersecting the Z axis at substantially 45°. The PBS 4 selectively transmits the linearly polarized illumination light IL3 (or IL5), which is in the first polarization state, and the linearly polarized illumination light IL7, which is in the second polarization state. In this manner, the combination of the half-wavelength plate 5 and the PBS 4 enables the PBS 4 to supply the depolarizer 6 with a plurality of different linear polarizations in different polarization directions without lowering the usage efficiency of the incident illumination light IL.

(3) The depolarizer 6 varies the illumination light IL3 (or IL4) in the first polarization state to the illumination light IL4 (or IL6), which is linearly polarized in the same polarization direction (third polarization state), and varies the illumination light IL7 in the second polarization state to the illumination light IL8, which is non-polarized (fourth polarization state). This generates linearly polarized illumination light in two perpendicular directions, or non-polarized illumination light, without lowering the usage efficiency of the incident illumination light IL.

(4) In FIG. 1, the PBS 4 is arranged between the half-wavelength plate 5 and the mask surface, and the depolarizer 6 is arranged between the PBS 4 and the mask surface. With such arrangements, even if the polarization state of the illumination light from the light source 1 slightly changes, illumination light linearly polarized in a constant predetermined direction can be supplied to the depolarizer 6. Thus, the polarization state of the illumination light irradiating the mask surface is accurately controlled.

(5) In FIG. 2(A), the half-wavelength plate 5 is rotatable about the axis 5Y (first rotation axis). The axis 5Y is equivalent to the optical axis AX1 of the illumination-optical system ILS but may be parallel to the optical axis AX1. Thus, the half-wavelength plate 5 can be rotated in accordance with the polarization state of the illumination light required for the mask surface.

(6) In this case, the half-wavelength plate 5 is rotated about the axis 5Y in accordance with the illumination conditions of the mask surface. This enables the control of polarization while maintaining a high illumination-light usage efficiency.

(7) The PBS 4 is rotatable about the axis 4Y (second rotation axis) and rotated in cooperation with the half-wavelength plate 5. The axis 4Y is equivalent to the optical axis AXI of the illumination-optical system ILS but may be parallel to the optical axis AX1. In this manner, rotation of the PBS 4 in cooperation with the half-wavelength plate 5 keeps the usage efficiency of the illumination light IL high and accurately sets the polarization state of the illumination light on the mask surface to either linearly polarized in two perpendicular direction or non-polarized.

(8) When the rotation angle of the half-wavelength plate 5 is θ, the PBS 4 is rotated by 2θ in cooperation with the half-wavelength plate 5. Generally, when the rotation angle of the half-wavelength plate 5 is θ, the polarization direction of the incident illumination light is rotated by 2θ. Accordingly, whenever the incident illumination light IL is linearly polarized, the rotation angle of the PBS 4 is two times greater than the rotation angle of the half-wavelength plate 5. Thus, linearly polarized light that differs in the polarization direction by 2θ from the incident illumination light IL is generated with a significantly low luminance loss.

(9) In FIG. 1, the half-wavelength plate 5 and the PBS 4 are rotated about a single rotation axis (optical axis AXI). In this case, a common drive unit 22 cooperatively rotates the half-wavelength plate 5 and the PBS 4. This simplifies the rotation mechanism.

(10) The rotation axis about which the half-wavelength plate 5 and the PBS 4 rotate may be the axis 5Y or axis 4Y of FIG. 2(A). However, the half-wavelength plate 5 and the PBS 4 may each be rotated by different rotation drive mechanisms.

(11) The depolarizer 6 includes the double-refraction crystal prism 6a. Accordingly, a component for generating light in a non-polarized state can easily be manufactured just by forming the crystal prism 6a to have a wedge shape.

Figure 4:
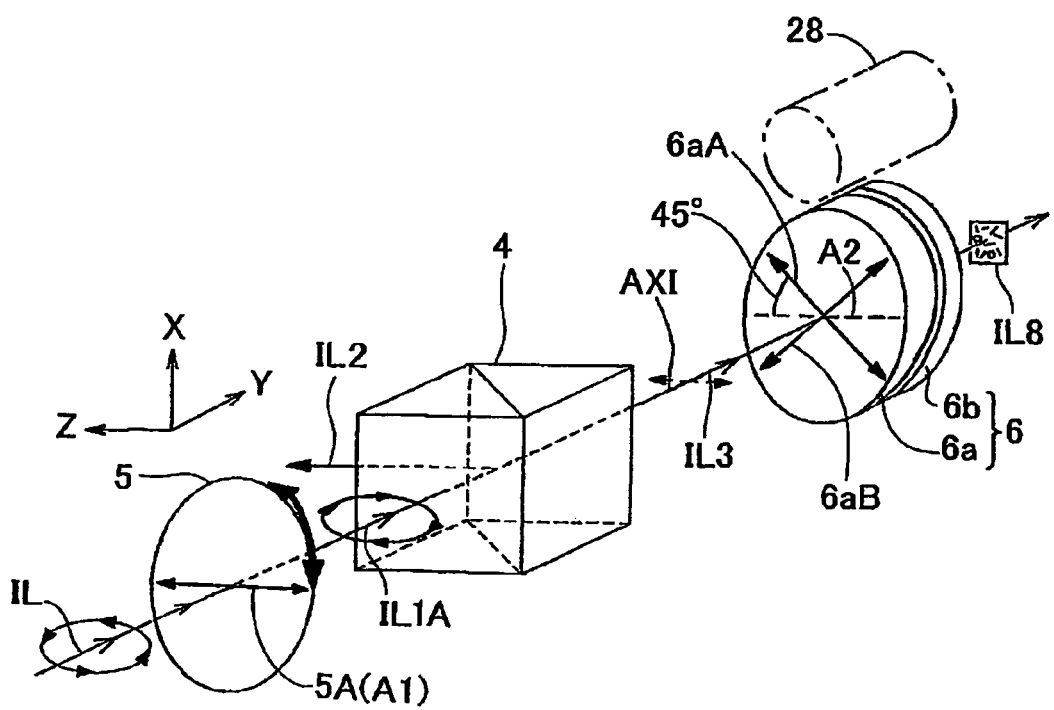
FIG. 4 is a perspective view showing a modification of the polarization-control unit shown in FIG. 1.

As shown in FIG. 4, the depolarizer 6 may be rotatable about the axis AXI or an axis (third rotation axis) parallel to the axis AXI to control the rotation angle of the depolarizer 6 with the drive unit 28. The drive unit 28 controlled by the illumination control system 21 of FIG. 1 may be formed by, for example, a gear mechanism that rotates a cylindrical member (not shown) for holding the depolarizer 6.

In a modification shown in FIG. 4, when shifting the polarization state of the illumination light illuminating the mask M to non-polarized, the rotation angles of the half-wavelength plate 5 and the PBS 4 are kept in the state (initial state) shown in FIG. 2(A), and the drive unit 28 rotates the depolarizer 6 from the initial state in the clockwise direction (or the counterclockwise direction) by 45°. In this state, the crystal axis 6aA of the crystal prism 6a is inclined by 45° relative to axis A2, which is parallel to the Z axis. As a result, the polarization direction of the illumination light IL3 polarized in the Z direction and directed from the PBS 4 to the depolarizer 6 is inclined by 45° relative to each of the crystal axes 6aA and 6aB of the crystal prism 6a. This emits non-polarized illumination light IL8 from the depolarizer 6. In the modification of FIG. 4, the polarization state of the illumination light IL3 entering the depolarizer 6 is accurately parallel to the Z axis. Thus, the non-polarized state is accurately set with high illumination efficiency.

(12) In FIG. 1, the half-wavelength plate 5 is used. Thus, by just controlling the rotation angle of the half-wavelength plate 5, the polarization direction of the emitted illumination light can be controlled.

Figure 6A:
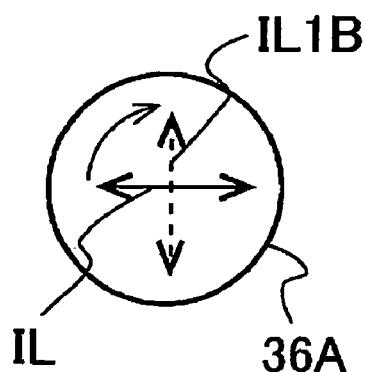
FIGS. 6(A) and 6(B) are each diagrams showing an optically active element that can be used in lieu of a half-wavelength plate 5.
Figure 6B:
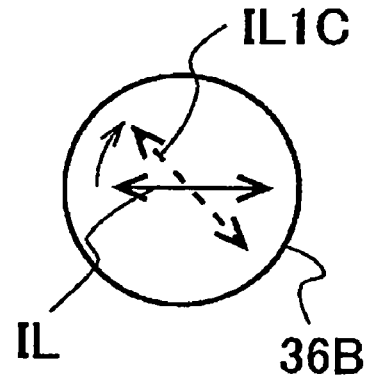

(13) Instead of the half-wavelength plate 5, as shown in FIGS. 6(A) and 6(B), optically active elements (optical rotation elements) 36A and 36B may be used to respectively rotate the polarization direction of the incident illumination light IL by 90° and 45° and emit illumination lights IL1B and IL1C. The optically active elements 36A and 36B are manufactured by controlling the thickness of a double-refraction material (a birefringence material), such as crystal. In this case, in lieu of the rotatable half-wavelength plate 5, the optically active elements 36A and 36B may be formed to be freely positionable in and out of an optical path of the illumination light IL. For example, a turret or the like may be used so that the optically active elements 36A and 36B are switchable in the optical path of the illumination light IL.

(14) Further, in the illumination optical system ILS of FIG. 1, the prism type PBS 4 is used to extract linearly polarized light from the light from the half-wavelength plate 5. The optical path of the incident light and emission light of the PBS 4 extend along the same straight line in the PBS4. This facilitates the designing and manufacturing of the optical system.

Figure 5A:
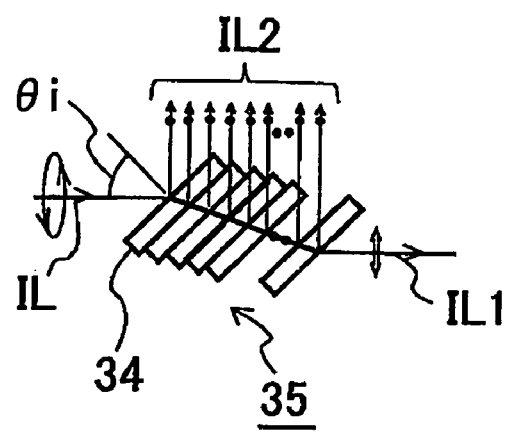
FIG. 5(A) is a diagram showing an optical member that can be used in lieu of a polarization beam splitter.

(15) When it is difficult to form a polarization beam splitter film on the PBS 4 for ArF excimer laser light and the manufacturing cost of the PBS 4 is high, an optical member 35 as shown in FIG. 5(A) may be used in lieu of the PBS 4. The optical member 35 is formed by diagonally stacking a plurality of (for example, ten to twenty) glass plates 34, which may be plates of silica having a thickness of about 1 mm, and extremely easy to manufacture. When the incident angle θi of the illumination light IL is 45° relative to the optical member 35 as shown in FIG. 5(A), on one surface of a glass plate 34, the transmission rate of the P-polarized illumination light IL1 is about 99%, and the transmission rate of the S-polarized illumination light IL2 is about 90%. Accordingly, when stacking, for example, fifteen glass plates 34 (with thirty surfaces), the S-polarization transmission rate falls to about 5% or less. Thus, the optical member 35 can be used as an inexpensive optical member for extracting only the P-polarized illumination light IL1 from the incident light.

Figure 5B:
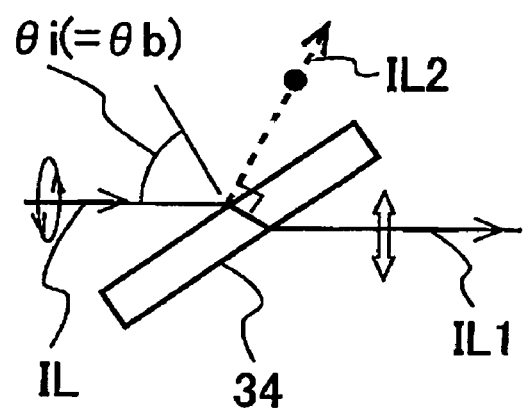
FIG. 5(B) is a diagram showing another example of use of the optical member of FIG. 5(A)

As shown in FIG. 5(B), by setting the incidence angle θi of the illumination light IL entering the glass plate 34 at the Brewster's angle θb, the transmission rate of the S-polarized illumination light IL2 in the glass plate 34 can be further decreased. Accordingly, the optical member 35 can be formed with less glass plates 34.

It is desirable that the optical member 35 (here, for example, ten to twenty diagonally stacked glass plates 34) have a complete or high extinction ratio. However, as long as the transmission rate of the optical member 35, which is for linear polarization in a polarization direction generally perpendicular to a desired polarization direction, is 10% or less, a pattern can be exposed without decreasing the contrast of a wafer pattern for a great extent.

(16) The illumination-optical system ILS shown in FIG. 1 is arranged in the optical path between the depolarizer 6 and the mask surface and includes the micro-lens array 11 (optical integrator), which uniformly illuminates the mask surface with illumination light. Thus, the illumination distribution on the mask surface is uniform. A normal fly's-eye lens can be used in lieu of the micro-lens array 11.

In lieu of the micro-lens array 11, which is a wave-surface divisional type integrator, a rod-type integrator can be used as an inner-surface reflection type optical integrator. In this case, referring to FIG. 1, a condenser-optical system is additionally arranged toward the mask M from the zoom lens 9 to form a conjugated plane of the diffractive optical elements (7A, etc.), and the rod-type integrator is arranged so that the incidence end is positioned near the conjugate plane.

Further, a relay optical system for forming on the mask M an image of an illumination field stop, which is arranged on or near an emission-end surface of the rod-type integrator. In such a structure, a secondary light source is formed on a pupil plane of the relay optical system (virtual image of the secondary light source is formed near the incidence end of the rod-type integrator). Further, a relay optical system for guiding light from the rod-type integrator to the mask M serves as a light-guide optical system.

(17) The illumination-optical system ILS further includes a relay optical system (13, 15) and the condenser-optical system 17 (light-guide optical system) for guiding light from the micro-lens array to the mask surface. This superimposes the light from the optical integrator and irradiates the mask M.

(18) The illumination-optical system ILS includes a light-intensity distribution formation means composed of the diffractive optical elements 7A to 7C, etc., freely positionable in and out of an optical path between the depolarizer 6 and the mask surface and forming illumination light having a light-intensity distribution of a predetermined shape. If the usage efficiency of the illumination light IL becomes decreased, an aperture-stop system including aperture stops of various shapes may be arranged on the illumination pupil plane in lieu of the diffractive optical elements.

(19) The embodiment of FIG. 1 includes the light source 1 for supplying the illumination light IL. In this embodiment, polarization may be controlled with high accuracy even if the polarization state of the illumination light IL from the light source 1 changes.

(20) In an exposure method for exposing a pattern onto a wafer W (photosensitive substrate) with the projection-optical system PL, the exposure method of the above-described embodiment includes an illumination step for illuminating a mask surface with the illumination-optical system ILS, and an exposure step for exposing a pattern of a mask on a mask surface onto the wafer W.

Further, the exposure apparatus of the above-described embodiment includes the illumination-optical system ILS, the light source 1 for supplying illumination light that illuminates the mask M arranged on a mask surface, and a projection-optical system PL for exposing a pattern of the mask M onto the mask surface.

In this case, polarization can be controlled with high accuracy. Thus, a fine pattern can be transferred onto the wafer W with a high resolution.

The present invention may be applied to a liquid-immersion type exposure apparatus disclosed in, for example, International Patent Publication No. 99/49504 or proximity-type exposure apparatus etc.

Figure 7:
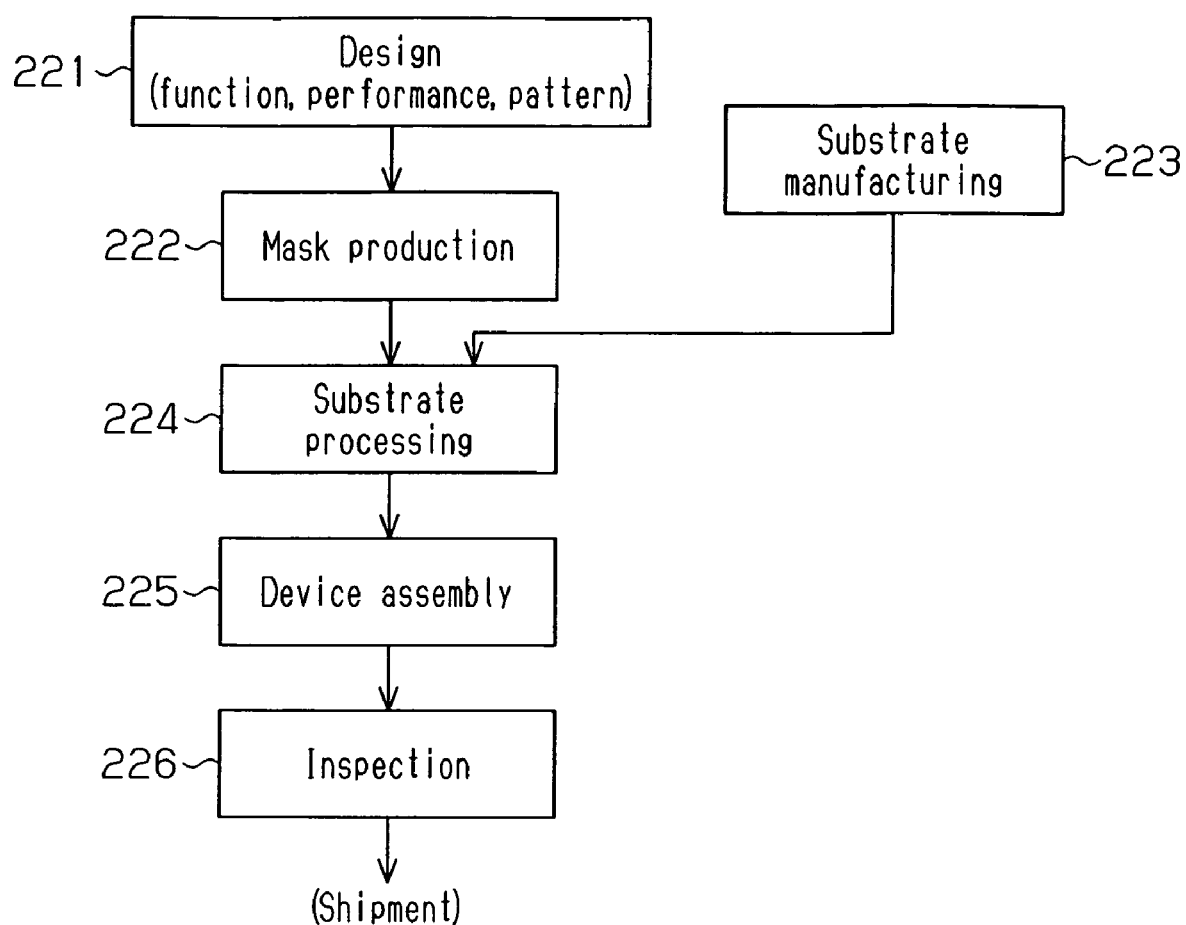
FIG. 7 is a flowchart showing a process for manufacturing a semiconductor device as an electronic device.

Further, when manufacturing an electronic device (microdevice) such as a semiconductor device using the exposure apparatus of the above-described embodiment, as shown in FIG. 7, the electronic device is manufactured by carrying out step 221 for designing the functions and performance of the electronic device, step 222 for producing a mask (reticle) based on the designing step, step 223 for manufacturing a substrate (wafer) serving as the base material of the device, substrate processing step 224 including a process for exposing a pattern of the mask onto the substrate with the exposure apparatus (projection-exposure apparatus) of the above-described embodiment, a process for developing the exposed substrate, and a process for heating (curing) and etching the developed substrate, a device-assembly step (processes including dicing, bonding, and packaging) 225, an inspection step 226, and the like.

In other words, this device-manufacturing method includes a lithography process and exposes a photosensitive substrate with the exposure apparatus of the above embodiment in the lithography process. Since polarization can be controlled with high accuracy to transfer a fine pattern onto the photosensitive substrate with a high resolution, an electronic device with sophisticated functions can be manufactured with high accuracy.

The application of the present invention is not limited to a semiconductor-device manufacturing process. The present invention may be widely applied to, for example, a process for manufacturing a liquid-crystal display device, a plasma display, or the like and a process for manufacturing various types of devices (electronic devices) such as an imaging device (CMOS type device, CCD, etc.), a micro-machine, a micro-electromechanical system (MEMS), a thin-film magnetic head, a DNA chip, or the like.

Further, the present invention was described above using an exposure apparatus that includes an illumination-optical apparatus as an example. However, it is apparent that the present invention may be applied to a typical illumination-optical system that illuminates an irradiated plane other than a mask.

What is claimed is:

1. An illumination optical apparatus for illuminating a plane with illumination light, the illumination optical apparatus comprising:
   a variable linear polarization element arranged in an optical path of the illumination light and which varies a polarization direction of the illumination light;
   a linear polarization extraction element arranged between the variable linear polarization element and the plane, and which selectively transmits linearly polarized light in a direction of the polarization direction of the illumination light; and
   a variable polarization state device arranged between the linear polarization extraction element and the plane, and which varies a polarization state of the illumination light.

2. The illumination optical apparatus according to claim 1, wherein:
   the variable linear polarization element varies the polarization state of the illumination light to substantially a first polarization state or a second polarization state; and the linear polarization extraction element selectively transmits linearly polarized light having the first polarization state or linearly polarized light having the second polarization state.

3. The illumination optical apparatus according to claim 2, wherein the variable polarization state device varies the first polarization state to a third polarization state, and varies the second polarization state to a fourth polarization state.

4. The illumination optical apparatus according to claim 2, wherein the variable linear polarization element is rotatable about a first rotation axis.

5. The illumination optical apparatus according to claim 4, wherein the variable linear polarization element is rotated about the first rotation axis in accordance with illumination conditions for illuminating the plane.

6. The illumination optical apparatus according to claim 4, wherein the linear polarization extraction element is rotatable about a second rotation axis and rotated in cooperation with the variable linear polarization element.

7. The illumination optical apparatus according to claim 6, wherein when expressing the rotation angle of the variable linear polarization element as θ, the linear polarization extraction element is rotated by angle 2θ in cooperation with the variable linear polarization element.

8. The illumination optical apparatus according to claim 6, wherein the variable linear polarization element and the linear polarization extraction element are rotatable about the same rotation axis.

9. The illumination optical apparatus according to claim 8, wherein the rotation axis includes the first rotation axis or the second rotation axis.

10. The illumination optical apparatus according to claim 2, wherein:
the variable polarization state device includes an optical member having a double refraction property; and
the optical member is rotatable about a third rotation axis.

11. The illumination optical apparatus according to claim 2, wherein the variable linear polarization element includes a half wavelength plate.

12. The illumination optical apparatus according to claim 2, wherein the variable linear polarization element includes an optically active element.

13. The illumination optical apparatus according to claim 2, wherein the variable linear polarization element includes at least two optically active elements which are switchable in the optical path of the illumination light.

14. The illumination optical apparatus according to claim 2, wherein the linear polarization extraction element includes a polarization beam splitter.

15. The illumination optical apparatus according to claim 2, wherein the linear polarization extraction device includes a plurality of stacked planar glass plates.

16. The illumination optical apparatus according to claim 1, further comprising an optical integrator which is arranged in an optical path between the variable polarization state device and the plane and which uniformly illuminates the plane with the illumination light.

17. The illumination optical apparatus according to claim 16, further comprising a light guide optical system which is arranged in an optical path between the optical integrator and the plane and which guides light from the optical integrator to the plane.

18. The illumination optical apparatus according to claim 1, further comprising a light intensity distribution formation means freely positionable in and out of an optical path between the variable polarization state device and the plane for forming the illumination light including a light intensity distribution of a predetermined shape.

19. The illumination optical apparatus according to claim 1, further comprising a light source which supplies the illumination light.

20. A method for illuminating an irradiated plane, defined on a mask, with illumination light and exposing a pattern of the mask onto a photosensitive substrate using a projection optical system, the method comprising:
varying a polarization direction of the illumination light in an optical path of the illumination light;
selectively transmitting linearly polarized light in a direction of the polarization direction of the illumination light of which the polarization direction was varied;
varying a polarization state of the illumination light that was selectively transmitted;
illuminating the irradiated plane with illumination light of which the polarization state was varied; and
exposing the pattern of the mask in the irradiated plane onto the photosensitive substrate.

21. An exposure apparatus comprising:
an illumination optical apparatus for illuminating a plane, defined on a mask, with illumination light, the illumination optical apparatus including:
a variable linear polarization element arranged in an optical path of the illumination light and which varies a polarization direction of the illumination light,
a linear polarization extraction element arranged between the variable linear polarization extraction element and the plane, and which selectively transmits linearly polarized light in a direction of the polarization direction of the illumination light, and
a variable polarization state device arranged between the linear polarization extraction element and the plane, and which varies a polarization state of the illumination light; and
a projection optical system which exposes a pattern of the mask onto the photosensitive substrate.

22. A method for manufacturing an electronic device, the method comprising:
directing illumination light from a light source to an irradiated plane defined on a mask including a pattern for the electronic device;
varying a polarization direction of the illumination light in an optical path of the illumination light;
selectively transmitting linearly polarized light in a direction of the polarization direction of the illumination light of which the polarization direction was varied;
varying a polarization state of the illumination light that was selectively transmitted;
illuminating the irradiated plane with illumination light of which the polarization state was varied; and
exposing the pattern of the mask onto a photosensitive substrate.

23. The illumination optical apparatus according to claim 1, wherein:
the linear polarization extraction element selectively transmits linearly polarized light in a direction of the polarization direction of the illumination light emitted from the variable linear polarization element; and
the variable polarization state device varies the polarization state of the illumination light emitted from the linear polarization extraction element.

* * * * *